United States Patent
Braat

(10) Patent No.: US 6,255,661 B1
(45) Date of Patent: Jul. 3, 2001

(54) MIRROR PROJECTION SYSTEM FOR A SCANNING LITHOGRAPHIC PROJECTION APPARATUS, AND LITHOGRAPHIC APPARATUS COMPRISING SUCH A SYSTEM

(75) Inventor: Josephus J. M. Braat, Eindhoven (NL)

(73) Assignee: U.S. Philips Corporation, New York, NY (US)

(*) Notice: Subject to any disclaimer, the term of this patent is extended or adjusted under 35 U.S.C. 154(b) by 0 days.

(21) Appl. No.: 09/170,467

(22) Filed: Oct. 13, 1998

(30) Foreign Application Priority Data

May 6, 1998 (EP) .................................................. 98201484

(51) Int. Cl.[7] ...................................................... G02B 5/08
(52) U.S. Cl. .......................... 250/492.2; 359/365; 378/34
(58) Field of Search ........................ 250/492.2; 359/365, 359/355, 858, 859; 378/34

(56) References Cited

U.S. PATENT DOCUMENTS

| | | | |
|---|---|---|---|
| 5,144,363 | 9/1992 | Wittekoek et al. | 355/53 |
| 5,191,200 | 3/1993 | Van Der Werf et al. | 250/201.4 |
| 5,222,112 * | 6/1993 | Terasawa | 378/34 |
| 5,686,728 | 11/1997 | Shafer | 250/492.2 |
| 5,815,310 * | 9/1998 | Williamson | 359/365 |
| 5,844,666 * | 12/1998 | Van Engelen | 355/72 |
| 5,973,826 * | 10/1999 | Chapman | 359/355 |

FOREIGN PATENT DOCUMENTS

0779528A2   6/1997   (EP) .

* cited by examiner

Primary Examiner—Teresa M. Arroyo
Assistant Examiner—Anthony Quash
(74) Attorney, Agent, or Firm—Steven R. Biren

(57) ABSTRACT

A mirror projection system for use in a step-and-scan lithographic projection apparatus, in which a mask pattern is repetitively scan-imaged on a number of areas of a substrate by means of a beam of EUV radiation, and having a cross-section shaped as a segment of a ring, has six imaging mirrors. The design is such that an intermediate image is formed between the fourth and the firth mirror from the object side, and the system has a relatively large working distance.

19 Claims, 2 Drawing Sheets

MIRROR PROJECTION SYSTEM FOR A SCANNING LITHOGRAPHIC PROJECTION APPARATUS, AND LITHOGRAPHIC APPARATUS COMPRISING SUCH A SYSTEM

BACKGROUND OF THE INVENTION

This invention relates to a mirror projection system for use in a step-and-scan lithographic projection apparatus for imaging a mask pattern, present in a mask, on a substrate by means of a beam of EUV radiation, which beam has a circular segment-shaped cross-section, said projection system being constituted by six imaging mirrors having ordinal numbers 1–6 from the object side to the image side, the first, the second, the fourth and the sixth mirror being concave and the fifth mirror being convex.

The invention also relates to a lithographic apparatus for step-and-scan imaging of a mask pattern on a number of areas of a substrate, which apparatus comprises such a mirror projection system.

EP-A 0 779 528 describes a mirror projection system for use in a step-and-scan lithographic apparatus with which an IC mask pattern is imaged on a number of areas of a semiconductor substrate, using EUV radiation. EUV, extreme ultraviolet, radiation is understood to mean radiation having a wavelength in the range between several nm and several tens of nm. This radiation is also referred to as soft X-ray radiation. The use of EUV radiation provides the great advantage that extremely small details, of the order of 0.1 μm or less, can be imaged satisfactorily. In other words, an imaging system in which EUV radiation is used has a very high resolving power without the NA of the system having to be extremely large, so that also the depth of focus of the system still has a reasonably large value. Since no suitable material of which lenses can be made is available for EUV radiation, a mirror projection system must be used for imaging the mask pattern on the substrate, instead of a hitherto conventional lens projection system.

The lithographic apparatuses currently used in the production of ICs are stepping apparatuses. In these apparatuses, a full field illumination is used, i.e. all areas of the mask pattern are illuminated simultaneously and these areas are simultaneously imaged on one IC area of the substrate. After a first IC area has been illuminated, a step is made to a subsequent IC area, i.e. the substrate holder is moved in such a way that the next IC area will be positioned under the mask pattern, whereafter this area is illuminated, and so forth until all IC areas of the substrate of the mask pattern are illuminated. As is known, it remains desirable to have ICs with an increasing number of components.

It is attempted to meet this desire not only by reducing the dimensions of these components but also by enlarging the surface areas of the ICs. This means that the, already relatively high, NA of the projection lens system must be further increased and, for a stepping apparatus, the image field of this system must also be further increased. This is practically impossible.

It has therefore been proposed to change from a stepping apparatus to a step-and-scan apparatus. In such an apparatus, a rectangular or circular segment-shaped sub-area of the mask pattern and hence also such a sub-area of an IC area of the substrate is illuminated, and the mask pattern and the substrate are moved synchronously through the illumination beam, taking the magnification of the projection system into account. A subsequent circular segment-shaped sub-area of the mask pattern is then imaged each time on a corresponding sub-area of the relevant IC area on the substrate. After the entire mask pattern has been imaged on an IC area in this way, the substrate holder performs a stepping movement, i.e. the beginning of a subsequent IC area is introduced into the projection beam and the mask is set to its initial position, whereafter said subsequent IC area is scan-illuminated via the mask pattern. This scan-imaging method may be used to great advantage in a lithographic apparatus in which EUV radiation is used as the projection radiation.

The embodiment of the projection system described in EP 0 779 528, intended for use with EUV radiation having a wavelength of 13 nm, has an NA of 0.20 at the image side. The annular image field has an inner radius of 29 mm and an outer radius of 31 mm and a length of 30 mm. The resolution of the system is 50 nm and the aberrations and distortions are sufficiently small to form a good image of a transmission mask pattern on an IC area of a substrate by way of a scanning process. The third mirror of this projection system is concave. A first pair of mirrors, consisting of the first and the second mirror, constitutes a magnified image of the object or the mask pattern. This image is transported by a second pair of mirrors, constituted by the third and the fourth mirror, and presented to a third pair of mirrors, constituted by the fifth and the sixth mirror, which provides the desired telecentric image with the required aperture NA=0.20. In this projection system, an intermediate image is formed between the third and the fourth mirror, and a diaphragm is situated on the second mirror.

In the known projection system, the mirror sections which constitute the third and the fourth mirror must be located at a relatively large distance from the optical axis of the system. This may cause alignment and stability problems. Moreover, the known system has a small free working distance of the order of 17 mm. In practice, a larger working distance is often required, for example, in connection with building in measuring systems.

It is an object of the present invention to provide a projection system of the type described in the opening paragraph, having a relatively large free working distance and being stable. To this end, the projection system according to the invention is characterized in that the third mirror is convex.

SUMMARY OF THE INVENTION

In the projection system in accordance with the novel concept, only one mirror element, the fourth mirror, is situated at a relatively large distance from the optical axis. The free working distance is, for example, a factor of six larger than that of the system described in EP-A 0 779 528. Now, an intermediate image is formed by the first four mirrors, which intermediate image is present at a position between the fourth and the fifth mirror. This intermediate image is directly imaged in the image plane by the fifth and the sixth mirror. In the novel projection system, the first mirror is placed close to the third mirror, whereas in the system in accordance with EP-A 0 779 528 the second mirror is placed close to the fourth mirror.

It is to be noted that U.S. Pat. No. 5,686,728 describes a six-mirror projection system for a step-and-scan apparatus. However, this projection system is designed for wavelengths in the range between 100 nm and 300 nm, i.e. not for EUV radiation. In U.S. Pat. No. 5,686,728 it is noted that such mirror projection systems are not suitable for EUV radiation. In the embodiment using six mirrors of the projection system described in U.S. Pat. No. 5,686,728, the first mirror is convex.

Within the above-mentioned novel design of the projection system, there is still some freedom of choice of the parameters of numerical aperture, magnification and size of the image field.

An embodiment of the projection system is characterized in that the system has a numerical aperture of the order of 0.20 nm at the image side, a magnification M=+0.25 and a circular segment-shaped image field having a width of 1.5 mm.

This projection system is suitable for imaging details having a size of the order of 50 nm.

The projection system is further preferably characterized in that all mirrors have aspherical surfaces.

An aspherical surface is understood to mean a surface whose fundamental shape is spherical but whose actual surface locally deviates from this fundamental shape so as to correct aberrations of the optical system of which this surface forms part.

By making all mirrors aspherical, a satisfactorily corrected system can be obtained with said image field and said numerical aperture.

The projection system is preferably further characterized in that it is telecentric at the image side.

Consequently, magnification errors due to undesired displacements of the substrate along the optical axis can be avoided.

The projection system may be further characterized in that a physically accessible diaphragm is situated between the second and the third mirror.

The system is then designed in such a way that there is sufficient space to provide a diaphragm at this position between the beams extending in opposite directions.

The invention also relates to a lithographic apparatus for step-and-scan imaging of a mask pattern, present in a mask, on a number of areas of a substrate, which apparatus comprises an illumination unit with a source for EUV radiation, a mask holder for accommodating a mask, a substrate holder for accommodating a substrate, and a projection system. This apparatus is characterized in that the projection system is a mirror projection system as described hereinbefore.

The mirror projection system may be used in combination with a transmissive mask. Then, the illumination system is situated at one side of the mask holder and the projection system is situated at the other side.

A lithographic apparatus having a shorter build-in length is, however, further characterized in that the mask is a reflective mask, and in that the illumination unit is situated at the same side of the mask holder as the projection system.

A reflective mask which is suitable for EUV radiation can be manufactured more easily than a transmissive mask for this radiation.

These and other aspects of the invention will be apparent from and will be elucidated with reference to the embodiments described hereinafter.

DESCRIPTION OF THE PREFERRED EMBODIMENTS

Figure 1:
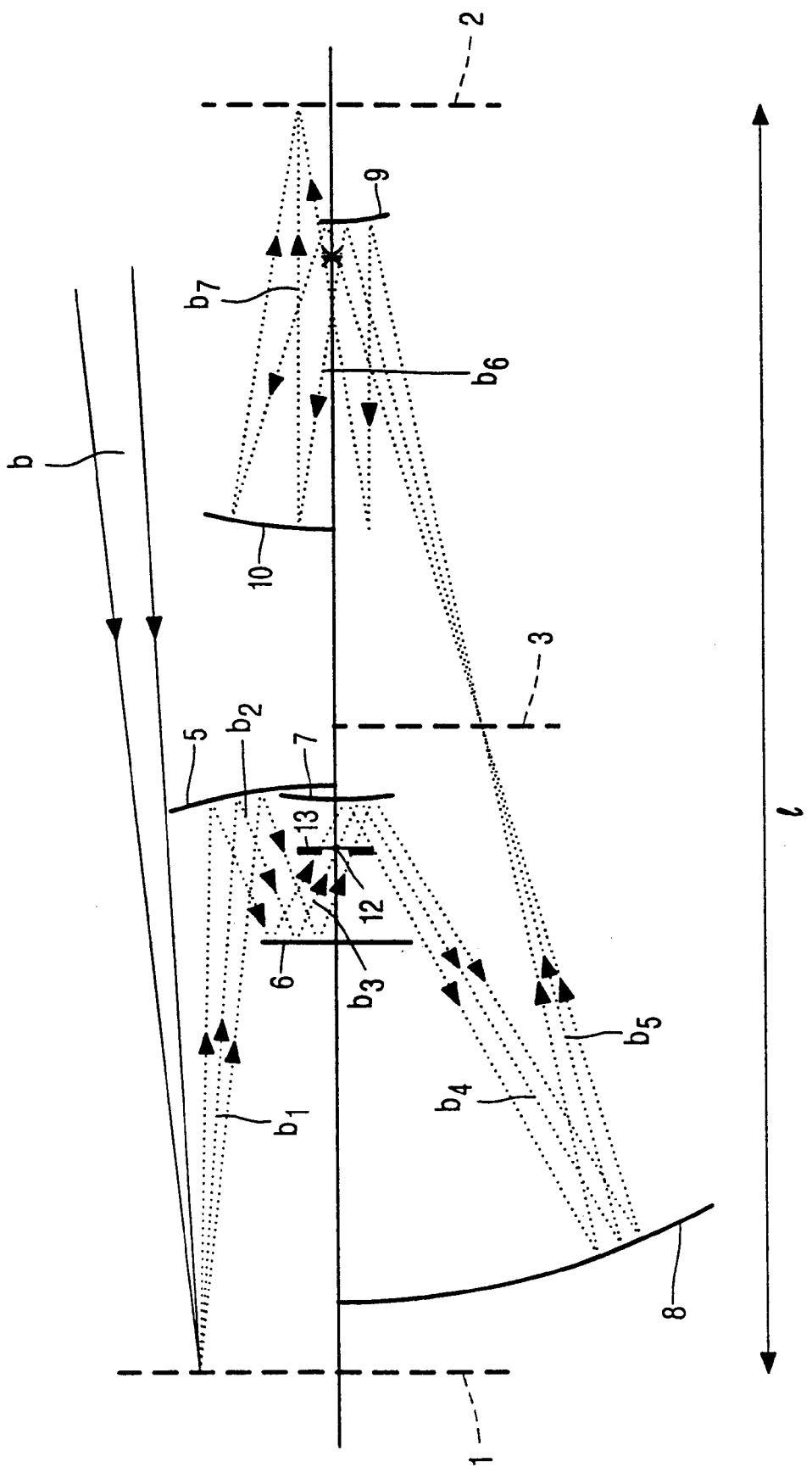
FIG. 1 shows an embodiment of the projection system according to the invention.

In FIG. 1, the object plane, in which the mask to be imaged can be arranged, is denoted by the reference numeral 1, and the image plane, in which the substrate can be arranged, is denoted by the reference numeral 2. If the mask is reflective, it is illuminated with a beam b coming from the right and emitted by a radiation source (not shown). The beam $b_1$ reflected by the reflective mask is incident on the first mirror 5 of the system, which mirror is concave. This mirror reflects the beam as a converging beam $b_2$ to the second mirror 6 which is slightly concave. The mirror 6 reflects the beam as a more strongly converging beam $b_3$ to the third mirror 7. Mirror 7 is a convex mirror and reflects the beam as a slightly diverging beam $b_4$ to the fourth mirror 8. This mirror is concave and reflects the beam as a converging beam $b_5$ to the fifth mirror 9 which is convex and reflects the beam as a diverging beam $b_6$ to the sixth mirror 10. This mirror is concave and focuses the beam a beam $b_7$ in the image plane 2. The mirrors 5, 6, 7 and 8 jointly form an intermediate image of the mask in the plane 3, and the mirrors 9 and 10 form the desired telecentric image in the image plane 2, i.e. in the plane of the substrate, from this intermediate image.

The pupil of the projection system is situated at the axial position 12. At this position, the beams $b_2$, $b_3$ and $b_4$ are separated sufficiently far from each other so that a diaphragm 13 can be placed at this position. As is known, a diaphragm prevents scattered radiation or radiation caused by unwanted reflections from reaching the image-forming beam in an imaging system, so that the contrast of the image formed in the plane 2 could be degraded. Moreover, the diaphragm ensures an identical beam cross-section and NA for all imaging beams so that the power of illumination and the resolution in the image field are constant.

Furthermore, all mirror surfaces of the system shown in FIG. 1 are aspherical. The system is thereby satisfactorily corrected for the desired aperture.

The system is coaxial, which means that the centers of curvature of all mirrors are located on one axis, the optical axis OO'. From the point of view of assembly and tolerances, this is very advantageous.

The following Table shows the values of the relevant parameters of the embodiment of FIG. 1. These parameters are:

the distances measured along the optical axis OO':

$d_1$: between the object plane 1 and the mirror 5;

$d_2$: between the mirror 5 and the mirror 6;

$d_3$: between the mirror 6 and the mirror 7;

$d_4$: between the mirror 7 and the mirror 8;

$d_5$: between the mirror 8 and the mirror 9;

$d_6$: between the mirror 9 and the mirror 10;

$d_7$: between the mirror 10 and the image plane 2, the radii of curvature measured along the optical axis:

$R_1$: of the mirror 5;

$R_2$: of the mirror 6;

$R_3$: of the mirror 7;

$R_4$: of the mirror 8;

$R_5$: of the mirror 9, $R_6$: of the mirror 10, the even terms $a_2$, $a_4$, $a_6$, $a_8$, $a_{10}$ and $a_{12}$ of the known series development:

$$Z = \sum_{i=1}^{6} a_{2i} \cdot r^{2i}$$

describing the variation of an aspherical surface.

TABLE $d_1$=480.0000 mm.
$d_2$=−130.0000
$d_3$=120.0000
$d_4$=−410.0000
$d_5$=882.9950
$d_6$=−248.8890
$d_7$=339.1210
$R_1$=−504.7420 mm.
$R_2$=4047.7788
$R_3$=306.4726
$R_4$=598.4006
$R_5$=295.0114
$R_6$=349.0336

|  | mirror 5 | mirror 6 | mirror 7 |
|---|---|---|---|
| $a_2$ | −.99062895E-03 | .12350676E-03 | .16314718E-02 |
| $a_4$ | .19325037E-08 | .21184080E-07 | −.12937833E-06 |
| $a_6$ | .22974309E-13 | −.52434963E-12 | .31503579E-10 |
| $a_8$ | .19248731E-18 | .44402990E-16 | −.10854546E-13 |
| $a_{10}$ | .18228577E-22 | −.33972268E-20 | .35055712E-17 |
| $a_{12}$ | −.30564185E-27 | .14682141E-24 | −.64250987E-21 |
|  | mirror 8 | mirror 9 | mirror 10 |
| $a_2$ | .83556775E-03 | .16949095E-02 | −.14325312E-02 |
| $a_4$ | .48147283E-09 | .22268835E-07 | .30333192E-08 |
| $a_6$ | .15723519E-14 | .94568728E-12 | .15977007E-13 |
| $a_8$ | −.18869035E-19 | .23709231E-15 | .46769410E-20 |
| $a_{10}$ | .19431967E-24 | −.17020338E-19 | .49062664E-23 |
| $a_{12}$ | −.78927285E-30 | −.11890177E-23 | −.13851990E-27 |

The system has a magnification M of +0.25, a numerical aperture NA of 0.20 and the circular segment of the image at the area of the image plane 2 has an inner radius of 27.5 mm and an outer radius of 29 mm, so that this plane is scanned with a circular segment-shaped spot having a width of 1.5 mm. The length, or cord, of this spot is of the order of 25 mm. The total length of the system, l in FIG. 1, is approximately 1057 mm. The system is intended for forming an image by means of radiation having a wavelength of 13 nm, and to this end, the mirrors are provided in known manner with a multilayer structure which reflects radiation of this wavelength as satisfactorily as possible. Examples of multilayer structures for this purpose are described in, inter alia, U.S. Pat. No. 5,153,898.

Figure 2:
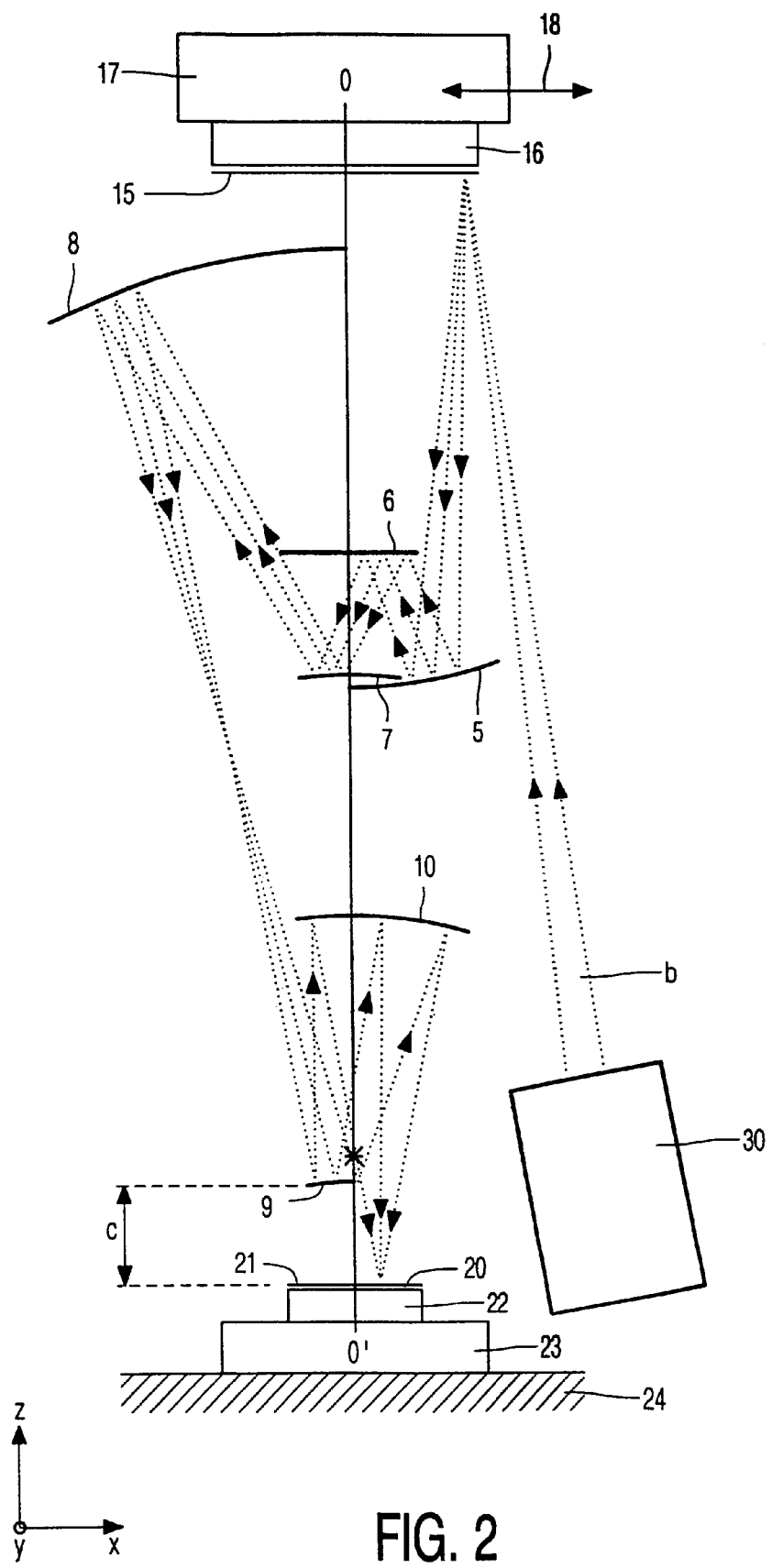
FIG. 2 shows diagrammatically an embodiment of a lithographic apparatus comprising such a projection system.

FIG. 2 shows very diagrammatically an embodiment of a step-and-scan lithographic apparatus which comprises a mirror projection system according to the invention for imaging a mask pattern, present in a reflective mask 15, on a substrate 20 which is provided with a layer 21 sensitive to EUV radiation. The apparatus comprises an illumination unit 30 which is shown diagrammatically, accommodating an EUV radiation source and an optical system for forming an illumination beam b whose cross-section has the shape of a circular segment. As is shown in the Figure, the illumination unit 30 can be placed close to the substrate table and the imaging section 9, 10 of the projection system, so that the illumination beam b can enter the projection column closely along these elements. The reflective mask 15 to be imaged is arranged in a mask holder 16 which forms part of a mask table 17, with which the mask can be moved in the scanning direction 18, and possibly in a direction perpendicular to the scanning direction, such that all areas of the mask pattern can be positioned under the illumination spot formed by the illumination beam b. The mask holder and mask table are shown only diagrammatically and may be implemented in various ways. The substrate 20 is arranged on a substrate holder 22 which is supported by a substrate table (stage) 23. This table can move the substrate in the scanning direction (X direction) but also in the Y direction perpendicular thereto. During scanning, the substrate and the mask move in the same direction. The substrate table is supported by a support 24.

Moreover, the substrate can be moved in the Z direction, the direction of the optical axis OO', and rotated about the Z axis. In sophisticated apparatuses, the substrate can also be tilted about the X axis and the Y axis. For further details of a step-and-scan apparatus, reference is made by way of example to PCT patent application WO 97/33204 (PHQ 96.004).

The optical free working distance c, i.e. the distance between the fifth mirror 9 and the plane of the substrate, is determined by the projection system and, apart from possible mechanical provisions, is relatively large, for example 90 mm. Consequently, optical sensors may be arranged in the space between the fifth mirror and the substrate. Such sensors, which are already used in stepping apparatuses or step-and-scan apparatuses in which a lens system is used as a projection system are, for example, a height and level sensor described in, for example U.S. Pat. No. 5,191,200 (PHQ 91.007) and an image sensor described in, for example U.S. Pat. No. 5,144,363 (PHQ 90.003).

The projection system is telecentric at the side of the substrate, which has the advantage that magnification errors caused by unwanted movements in the Z direction of the substrate with respect to the projection system are avoided.

The EUV lithographic projection apparatus may be used in the manufacture of ICs but also, for example, liquid crystalline display panels, integrated or planar optical systems, magnetic heads and guidance and detection patterns for magnetic domain memories.

What is claimed is:

1. A mirror projection system for use in a step-and-scan lithographic projection apparatus for imaging a mask pattern, present in a mask, on a substrate by means of a beam of EUV radiation, which beam has a circular segment-shaped cross-section, said projection system comprising six imaging mirrors having ordinal numbers 1–6 from the object side to the image side, the first, the second, the fourth and the sixth mirror being concave and the fifth mirror being convex, characterized in that the third mirror is convex.

2. A mirror projection system as claimed in claim 1, wherein the system has a numerical aperture of the order of 0.20 at the image side, a magnification M=+0.25 and a circular segment-shaped image field having a width of 1.5 mm.

3. A mirror projection system as claimed in claim 1, wherein all of the mirrors have aspherical surfaces.

4. A mirror projection system as claimed in claim 1, the system is telecentric at the image side.

5. A mirror projection system as claimed in claim 1, further comprising a physically accessible diaphragm situated between the second and the third mirror.

6. A lithographic apparatus for step-and-scan imaging of a mask pattern, present in a mask, on a number of areas of a substrate, which apparatus comprises an illumination unit with a source of EUV radiation, a mask holder for accommodating a mask, a substrate holder for accommodating a substrate, and a mirror projection system as claimed in claim 1.

7. A lithographic apparatus as claimed in claim 6, wherein the mask is a reflective mask, and the illumination unit is situated at the same side of the mask holder as the projection system.

8. The lithographic apparatus as claimed in claim 6 further comprising means for moving the mask holder and the substrate holder in the same direction during a scanning operation.

9. The lithographic apparatus as claimed in claim 8 further comprising means for moving the substrate holder in a direction perpendicular to said same direction of movement.

10. The lithographic apparatus as claimed in claim 9 further comprising means for moving the substrate holder in a direction parallel to an optical axis of the mirror projection system, the substrate holder being mounted for rotation about the optical axis.

11. The lithographic apparatus as claimed in claim 8 wherein a space of about 90 mm is provided between the fifth mirror and the plane of the substrate.

12. The lithographic apparatus as claimed in claim 8 wherein the EUV radiation has a wavelength of approximately 13 nm.

13. The mirror projection system as claimed in claim 1 wherein the third mirror intersects the optical axis of the mirror projection system.

14. The mirror projection system as claimed in claim 1 wherein,
an intermediate image is formed between said fourth mirror and said fifth mirror.

15. The mirror projection system as claimed in claim 1 wherein the second mirror and the third mirror each intersect the optical axis of the mirror projection system.

16. The mirror projection system as claimed in claim 1 wherein the first and third mirrors are positioned adjacent to one another.

17. The mirror projection system as claimed in claim 14 wherein the fifth and sixth mirrors together form a telecentric image in the plane of the substrate.

18. The mirror projection system as claimed in claim 1 wherein the six mirrors are positioned along the optical axis of the system so that the system is coaxial.

19. The mirror projection system as claimed in claim 1 which includes only the six mirrors specified in claim 1.

* * * * *